US010615280B2

(12) United States Patent
Armstrong et al.

(10) Patent No.: US 10,615,280 B2
(45) Date of Patent: Apr. 7, 2020

(54) REDUCED PUNCHTHROUGH BREAKDOWN IN GALLIUM-NITRIDE TRANSISTORS

(71) Applicant: Intel Corporation, Santa Clara, CA (US)

(72) Inventors: Mark Armstrong, Portland, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/081,112

(22) PCT Filed: Mar. 22, 2016

(86) PCT No.: PCT/US2016/023499
§ 371 (c)(1),
(2) Date: Aug. 30, 2018

(87) PCT Pub. No.: WO2017/164841
PCT Pub. Date: Sep. 28, 2017

(65) Prior Publication Data
US 2019/0088773 A1    Mar. 21, 2019

(51) Int. Cl.
*H01L 29/78*    (2006.01)
*H01L 29/06*    (2006.01)
*H01L 29/10*    (2006.01)
*H01L 29/20*    (2006.01)
*H01L 29/66*    (2006.01)
*H01L 29/778*    (2006.01)

(52) U.S. Cl.
CPC ........ *H01L 29/785* (2013.01); *H01L 29/0657* (2013.01); *H01L 29/1037* (2013.01); *H01L 29/1083* (2013.01); *H01L 29/2003* (2013.01); *H01L 29/66522* (2013.01); *H01L 29/7786* (2013.01); *H01L 29/78* (2013.01)

(58) Field of Classification Search
None
See application file for complete search history.

(56) References Cited

U.S. PATENT DOCUMENTS

2008/0315256 A1    12/2008    Ohta et al.
2013/0099245 A1*    4/2013    Ando ................ H01L 29/4232
                                                    257/76
(Continued)

FOREIGN PATENT DOCUMENTS

JP    2006303475 A  *  11/2006
JP    2006303475 A       11/2006

OTHER PUBLICATIONS

PCT Dec. 8, 2016 International Search Report and Written Opinion issued in PCT Application No. PCT/US2016/023499 dated Dec. 8, 2016; 11 pages.

*Primary Examiner* — Reema Patel
*Assistant Examiner* — Steven M Christopher
(74) *Attorney, Agent, or Firm* — Patent Capital Group (57) ABSTRACT

There is disclosed in an example, a gallium nitride (GaN) field effect transistor (FET) having a gate, a drain, and a source, having: a doped GaN buffer layer; a first epitaxy layer above the buffer layer, the first epitaxy layer having a first doping profile (for example, doped, or p-type doping); and a second epitaxy layer above the first epitaxy layer, the second epitaxy layer having a second doping profile (for example, undoped, or n-type doping).

23 Claims, 7 Drawing Sheets

(56) References Cited

U.S. PATENT DOCUMENTS

| | | | |
|---|---|---|---|
| 2014/0094223 A1* | 4/2014 | Dasgupta | H01L 29/4236 |
| | | | 455/566 |
| 2014/0264379 A1 | 9/2014 | Kub et al. | |
| 2015/0021660 A1* | 1/2015 | Chen | H01L 29/66462 |
| | | | 257/190 |
| 2015/0270249 A1 | 9/2015 | Cho | |

* cited by examiner

REDUCED PUNCHTHROUGH BREAKDOWN IN GALLIUM-NITRIDE TRANSISTORS

CROSS-REFERENCE TO RELATED APPLICATIONS

This Application is a national stage application under 35 U.S.C. § 371 of PCT Application PCT/US2016/023499, filed Mar. 22, 2016, and entitled "REDUCED PUNCHTHROUGH BREAKDOWN IN GALLIUM-NITRIDE TRANSISTORS," which is hereby incorporated by reference in its entirety.

FIELD OF THE SPECIFICATION

This disclosure relates in general to the field of semiconductor devices, and more particularly, though not exclusively to, a system and method for reducing punchthrough breakdown in gallium-nitride transistors.

BACKGROUND

In manufacturing processes, gallium-nitride (GaN) may be used as a semiconductor substrate. For example, GaN may be used, with selective doping, to create a field effect transistor (FET), a three-node device having a gate, a drain, and a source.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

SUMMARY

There is disclosed in an example, a gallium nitride (GaN) field effect transistor (FET) having a gate, a drain, and a source, having: a doped GaN buffer layer; a first epitaxy layer above the buffer layer, the first epitaxy layer having a first doping profile (for example, doped, or p-type doping); and a second epitaxy layer above the first epitaxy layer, the second epitaxy layer having a second doping profile (for example, undoped, or n-type doping).

Embodiments of the Disclosure

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

Gallium nitride (GaN) transistors are useful for many modern semiconductor processes, including the production of FETs. These FETs can include both traditional MOSFETs and special-purpose power FETs.

Power MOSFET devices made from GaN can handle a higher maximum input voltage than other materials, such as silicon, because of the electrical breakdown characteristics of GaN. But a GaN FET may not be able to take advantage of the full electrical strength of GaN because of punchthrough of the substrate caused by the depletion region of the transistor. This is especially true in short-channel devices.

Many existing GaN power FETs are designed to handle input voltages in the kilovolt or tens of kilovolt range. These transistors have relatively long channels, and thus may experience less punch-through in certain embodiments simply because the depletion region has a large length to traverse.

However, GaN power FETs need not be configured for kilovolt input voltages. They may also be configured, for example, to receive an input voltage in the tens or hundreds of volts. This class of devices may have a much shorter channel. It is advantageous to make such GaN FETs smaller than their kilovolt counterparts, because transistor feature size is a premium design consideration in many integrated circuits. In these cases, with a shorter channel, punchthrough may become a limiting factor. The actual maximum input voltage of a GaN FET can be limited by punch-through in the substrate rather than other design considerations. This can prevent the device from taking full advantage of the electrical strength of GaN, especially in short-channel devices. Thus, embodiments of the present disclosure are configured to limit the punch-through effect in short-channel GaN FETs, including GaN power FETs.

In an example, an undoped GaN layer is added to a planar GaN MOSFET, above the traditionally doped epitaxy layer. This can be a discrete layer, with a sharp transition from the doped epitaxy layer to the undoped layer, or it can be a graduated transition from a doped layer to a completely or nearly undoped region at the top. Note that in some cases, this region may not be completely undoped, but may have doping substantially less than the doping of the normal epitaxy layer. In other embodiments, the epitaxy layer may be doped with a first polarity, and the "undoped" epi layer may be doped with a second polarity. Thus, more generally speaking, the first epitaxy layer is doped according to a first doping profile (referred to as "doped" throughout this disclosure). This layer may be referred to as the "doped epitaxy layer" throughout this Specification. The second, upper epitaxy layer may be doped with a second doping profile (referred to as "undoped" throughout this disclosure), which may include little doping, no doping, or doping of opposite polarity to the doped epitaxy layer. This layer may be referred to throughout this Specification as the "undoped epitaxy layer," and that term is intended to encompass any of the embodiments disclosed herein, or any embodiments otherwise consistent with this disclosure and the appended claims. For an integrated circuit, the thickness of the undoped epitaxy layer may be between approximately 20 nm and 100 nm.

The undoped epitaxy layer may provide an increased punchthrough voltage, as the doping in the doped layer can be increased without affecting mobility.

Figure 7:
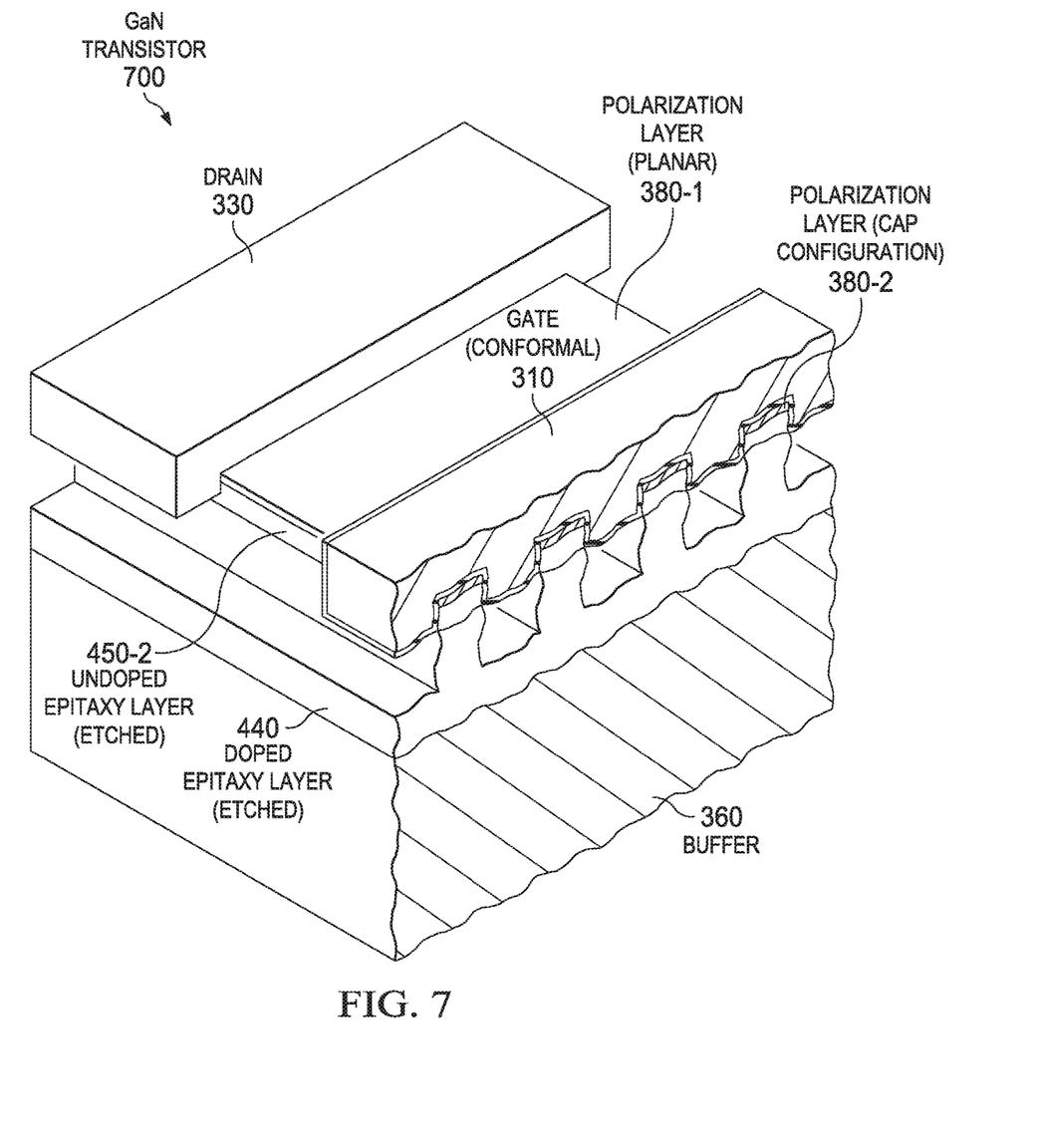
FIG. 7 is a cutaway perspective view of a GaN transistor according to one or more examples of the present Specification.
Figure 8:
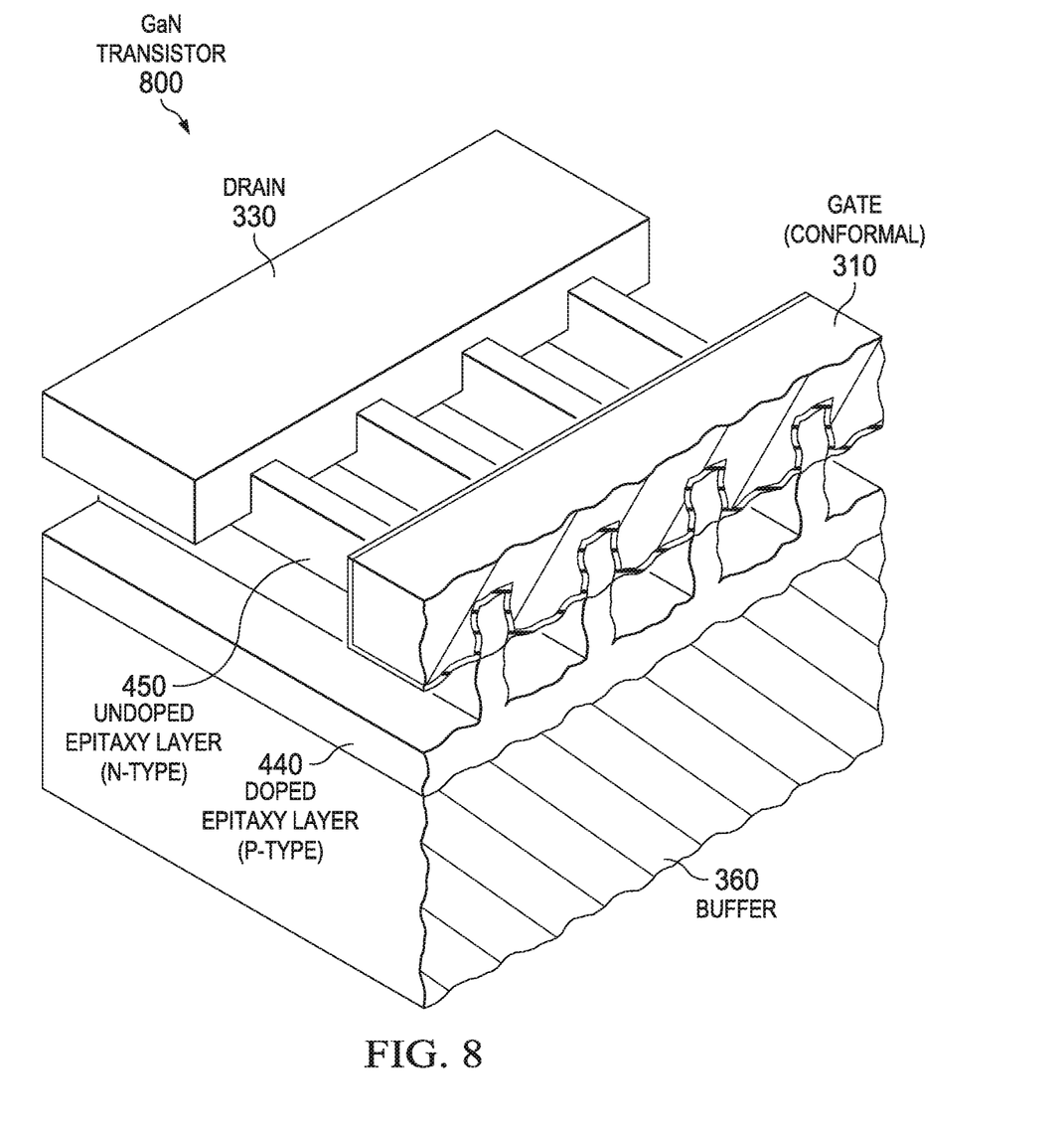
FIG. 8 is a cutaway perspective view of a GaN transistor according to one or more examples of the present Specification.

Several illustrative embodiments of doped and undoped epitaxy layers are disclosed throughout this Specification. These are provided earnestly for the purpose of aiding in understanding the claimed subject matter, and should be understood to be nonlimiting examples. Embodiments include, for example, a retrograde well doping profile used to increase punch-through voltage of the GaN power MOSFET. An example of this embodiment, including a planar epitaxy layer, is disclosed in FIGS. 3-5. In a second embodiment, disclosed in FIG. 6, an etched epitaxy layer is disclosed. FIG. 7 discloses a hybrid planar/etched epitaxy. FIG. 8 discloses a "finned" epitaxy layer. These various embodiments allow excellent punchthrough control without the need for heavy well doping.

A system and method for providing reduced punchthrough breakdown in GaN transistors will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

Figure 1:
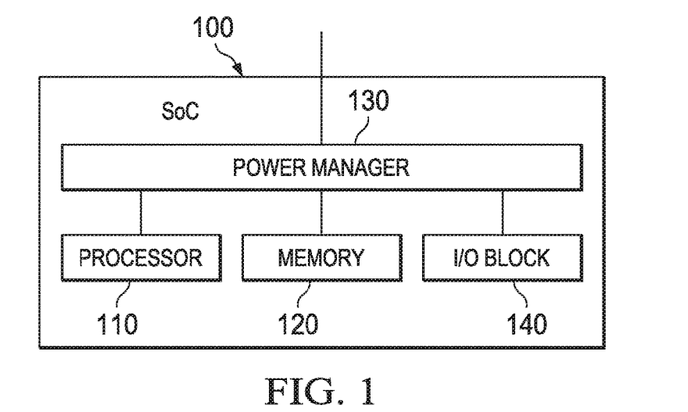
FIG. 1 is a block diagram of a system on a chip according to one or more examples of the present Specification.

FIG. 1 is a block diagram of system-on-a chip (SoC) 100 according to one or more examples of the present Specification. SoC 100 is disclosed as a nonlimiting example, but in a more general sense, the teachings of this Specification are applicable to providing any suitable computing device. In various embodiments, a "computing device" may be or comprise, by way of non-limiting example, a computer, workstation, server, mainframe, virtual machine (whether emulated or on a "bare-metal" hypervisor), embedded computer, embedded controller, embedded sensor, personal digital assistant, laptop computer, cellular telephone, IP telephone, smart phone, tablet computer, convertible tablet computer, computing appliance, network appliance, receiver, wearable computer, handheld calculator, or any other electronic, microelectronic, or microelectromechanical device for processing and communicating data.

In this example, SoC 100 includes a number of computing elements, which include any active or passive elements of SoC 100 that contribute to SoC 100 to perform its intended function. In this example, processor 110 is connected to a memory 120, having stored therein executable instructions for providing appropriate software, such as an operating system and operational software. Other components of SoC 100 include an input/output (I/O) block 140 and a power manager 130. This architecture is provided by way of example only, and is intended to be non-exclusive and non-limiting. In a specific example, each of the listed components may be a physically separate intellectual property (IP) block, designed in advance for use on SoC 100, and each may occupy a separate space on a silicon wafer. The separate IP blocks may communicate with each other via an on-chip interconnect fabric.

In other examples, the various disclosed blocks may be logical divisions only, and need not necessarily represent physically separate hardware and/or software components. Certain computing devices provide main memory and storage, for example, in a single physical memory device, and others provide them in separate devices. In the case of virtual machines or hypervisors, all or part of a function may be provided in the form of software or firmware running over a virtualization layer to provide the disclosed logical function. In other examples, a device such as a network interface may provide only the minimum hardware interfaces necessary to perform its logical operation, and may rely on a software driver to provide additional necessary logic. Thus, as appropriate to the embodiment, each logical block disclosed herein may broadly include one or more logic elements configured and operable for providing the disclosed logical operation of that block. As used throughout this Specification, a "logic element" may include hardware, external hardware (digital, analog, or mixed-signal), software, reciprocating software, services, drivers, interfaces, components, modules, algorithms, sensors, components, firmware, microcode, programmable logic, or objects that can coordinate to achieve a logical operation.

In an example, processor 110 may be communicatively coupled to memory 120 via any suitable memory bus, which may be for example a direct memory access (DMA) or any other suitable bus. Processor 110 may be communicatively coupled to other devices via a system bus or fabric. As used throughout this Specification, a "fabric" includes any wired or wireless interconnection line, network, connection, bundle, single bus, multiple buses, crossbar network, single-stage network, multistage network or other conduction medium operable to carry data, signals, or power between parts of a computing device, or between computing devices. It should be noted that these uses are disclosed by way of non-limiting example only, and that some embodiments may omit one or more of the foregoing buses, while others may employ additional or different buses.

In various examples, a "processor" may include any combination of logic elements operable to execute instructions, whether loaded from memory, or implemented directly in hardware, including by way of non-limiting example a microprocessor, digital signal processor, field-programmable gate array, graphics processing unit, programmable logic array, application-specific integrated circuit, or virtual machine processor. In certain architectures, a multi-core processor may be provided, in which case processor 110 may be treated as only one core of a multi-core processor, or may be treated as the entire multi-core processor, as appropriate. In some embodiments, one or more co-processor may also be provided for specialized or support functions.

To simplify this disclosure, memory 120 is disclosed as a single logical block, but in a physical embodiment may include one or more blocks of any suitable volatile or non-volatile memory technology or technologies, including for example DDR RAM, SRAM, DRAM, cache, L1 or L2 memory, on-chip memory, registers, flash, ROM, optical media, virtual memory regions, magnetic or tape memory, or similar. In certain embodiments, memory 120 may comprise both a relatively low-latency volatile main memory, and a relatively higher-latency non-volatile memory. However, the two species of memory need not be physically separate devices, and in some examples may represent simply a logical separation of function (for example, in some devices, all memory is volatile, or all memory is nonvolatile). It should also be noted that although DMA is disclosed by way of non-limiting example, DMA is not the only protocol consistent with this Specification, and that other memory architectures are available.

Memory 120 may include one or more non-transitory computer-readable mediums, including by way of non-limiting example, a hard drive, solid-state drive, external storage, redundant array of independent disks (RAID), network-attached storage, optical storage, tape drive, backup system, cloud storage, or any combination of the foregoing. Memory 120 may be, or may include therein, a database or databases or data stored in other configurations, and may include a stored copy of operational software such as an operating system and operational software. Many other configurations are also possible, and are intended to be encompassed within the broad scope of this Specification.

I/O block 140 may be provided to communicatively couple SoC 100 to a wired or wireless network. A "network," as used throughout this Specification, may include any communicative platform operable to exchange data or information within or between computing devices, including by way of non-limiting example, serial or parallel communication ports, an ad-hoc local network, an internet architecture providing computing devices with the ability to electronically interact, an asynchronous transfer mode (ATM) network, a plain old telephone system (POTS), which computing devices could use to perform transactions in which they may be assisted by human operators or in which they may manually key data into a telephone or other suitable electronic equipment, any packet data network (PDN) offering a communications interface or exchange between any two nodes in a system, or any local area network (LAN), metropolitan area network (MAN), wide area network (WAN), wireless local area network (MAN), virtual private network (VPN), intranet, or any other appropriate architecture or system that facilitates communications in a network or telephonic environment.

Power manager 130 may be or include a power supply, as well as logic to regulate power to SoC 100. For example, power manager 130 may include logic to detect different operating modes, and to intelligently provide a regulated voltage to on-chip components as the demands of those operating modes dictate.

For example, temperature sensors within power manager 130 may detect when the temperature of processor 110 rises above a threshold, which may indicate that processor 110 is in danger of being damaged. To prevent damage, power manager 130 may reduce the voltage supplied to processor 110, thus reducing the operating power, and reducing the temperature.

Power manager 130 may also supply different input voltages to different computing elements of SoC 100 according to the power demands of those processing elements. In various embodiments, power manager 130 may also include current limiters, voltage references, meters, sensors, transducers, drivers, switches, and any other elements that assist power manager 130 in performing its work.

Figure 2:
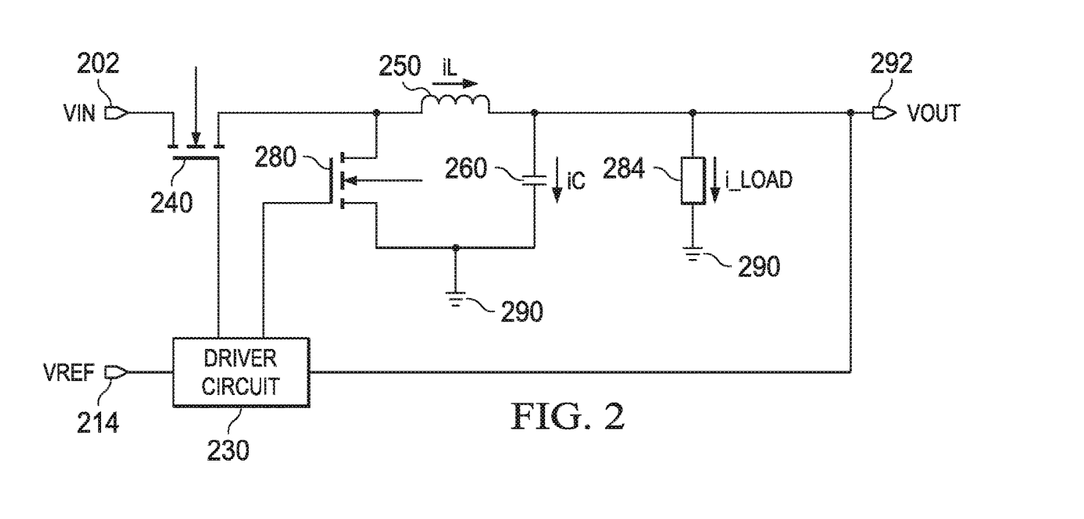
FIG. 2 is a block diagram of a power supply according to one or more examples of the present Specification.

FIG. 2 is an electrical block diagram of a switching regulator 200 according to one or more examples of the present Specification. Switching regulators are a type of power supply that exploit the energy storage properties of inductors and capacitors to receive an input voltage and step up, step down, or otherwise regulate an output voltage. In a switching regulator, during a first time span an inductor may have up to the full, unregulated input voltage applied across it. During this first time span, the inductor's current builds up, storing $½LI^2$ of energy in its magnetic field. During a second time span, energy is transferred from the inductor to a filter capacitor, which smooths the output. When a grounded switch is placed between the inductor and the capacitor, opening and closing the switch alternates between the foregoing first time span and second time span. Note that switching regulator may be provided in any suitable form, such as on a prototype board, on a commercially produced printed circuit board (PCB), or as part of an SoC such as SoC 100, in which case switching regulator 200 may not include any discrete components.

Switching regulator 200 receives an input voltage $V_{in}$ 202, and provides an output voltage $V_{out}$ 292. In an example, $V_{in}$ 202 may be a substantially steady-state DC input voltage, while $V_{out}$ is ideally a perfect DC output voltage that may be either stepped up or stepped down from $V_{in}$ ($V_{out}=kV_{in}$, where k is a step-up or step-down factor). FIG. 2 specifically shows, by way of non-limiting example, a "buck"-style converter, wherein $V_{out}$ is stepped down from $V_{in}$, while the output current is stepped up.

An inductor 250 receives across it a potential difference, which in an example may be up to the full $V_{in}$, and more specifically may be $V_L=V_{in}-V_{out}$. Inductor 250 is provided by way of non-limiting example only, and it is not intended herein that inductor 250 be restricted to a particular value. Furthermore, inductor 250 can be readily replaced with any inductor, transformer, winding, electrical machine, or other device operable to provide a useful inductance L. Similarly, capacitor 260 is provided by way of non-limiting example, and it is not intended herein that capacitor 260 be restricted to a particular value. Capacitor 260 can also be readily replaced with any capacitor, buffer, or storage cell operable to provide a useful capacitance C.

A transistor 280 is disposed between inductor 260 and ground 290. In an example, transistor 280 may be a GaN power FET. In this example, a capacitor 260 is also referenced to ground 290, which may be any suitable reference or $V^-$ node. Throughout these figures, certain voltage reference terms are used by way of example only, and should be understood in that context. For example, certain example circuits may include a positive node $V^+$ and a negative node $V^-$. Nodes $V^+$ and $V^-$ both have many possible values. By convention, $V^+$ is spoken of as being the most "positive" voltage and $V^-$ is spoken of as being the most "negative" voltage. Thus, under appropriate circumstances, either $V^+$ or $V^-$ could be considered a "supply" or "positive" voltage, and under other circumstances, either $V^+$ or $V^-$ could be considered a "ground," "negative," or "negative supply" voltage. It should be noted that $V^-$ need be neither an absolute ground ("earth" or "chassis"), nor necessarily negative with respect to earth or chassis ground. Furthermore, "positive" and "negative" may be understood to refer simply to two opposite sides of a difference in potential. In some embodiments, a zero point is defined at earth ground or chassis ground and $V^+$ and $V^-$ may have values of substantially the same magnitude but opposite sign.

A transistor 240 acts as a switch. Transistor 240 may be understood generally to be any three-node transconductor, including a bipolar junction transistor (BJT), triode, field-effect transistor (FET), or similar. In one embodiment, transistor 240 is a GaN power FET. Transistor 240 has a gate node controlled by driver circuit 230. Driver circuit 230 may provide any appropriate on-off switching waveform at the gate of transistor 240, such as a square wave with an appropriate duty cycle. In some embodiments, driver circuit 230 may also control the gate input of transistor 280, which may receive a complementary waveform to that of transistor 240 (e.g., when transistor 240 is switched "on," transistor 280 is switched "off"). In this example, driver circuit 230 is placed in a feedback configuration with $V_{out}$ 292 and is disposed to measure $V_{out}$ 292 and to provide an appropriate switching frequency to drive a desired output on $V_{out}$ 292.

$V_{out}$ 292 may be provided to a load 284, referenced to ground 290. A current $i_{load}$ flows through load 284, while a capacitor current $i_C$ flows through capacitor 260 and a current $i_L$ flows through inductor 250. Because switching regulator 200 is a buck-style converter, switching regulator 200 converts from a higher input voltage to a lower output voltage, with a correspondingly higher output current, maintaining input and output power substantially the same.

Driver circuit 230 may also receive an input reference voltage $V_{ref}$ and is operable to provide a control signal to regulate transistors 240 and 280, and provide a switching frequency of transistor 240. Reference voltage $V_{ref}$ 214 may be considered a theoretically-perfect DC voltage level providing the nominal value of $V_{out}$ 292. $V_{ref}$ 214 may be provided for example by a voltage reference such as one or more diodes, Zener diodes, bandgap references, or other suitable device.

In steady-state operation, transconductor 240 alternates between on and off states in a repeating periodic manner, such that the inductor current forms a repeating triangle wave whose average value is equal to the load current. The peaks and troughs of the inductor current are filtered out by capacitor 260, which charges and discharges with the rippling portion of this current.

Figure 3:
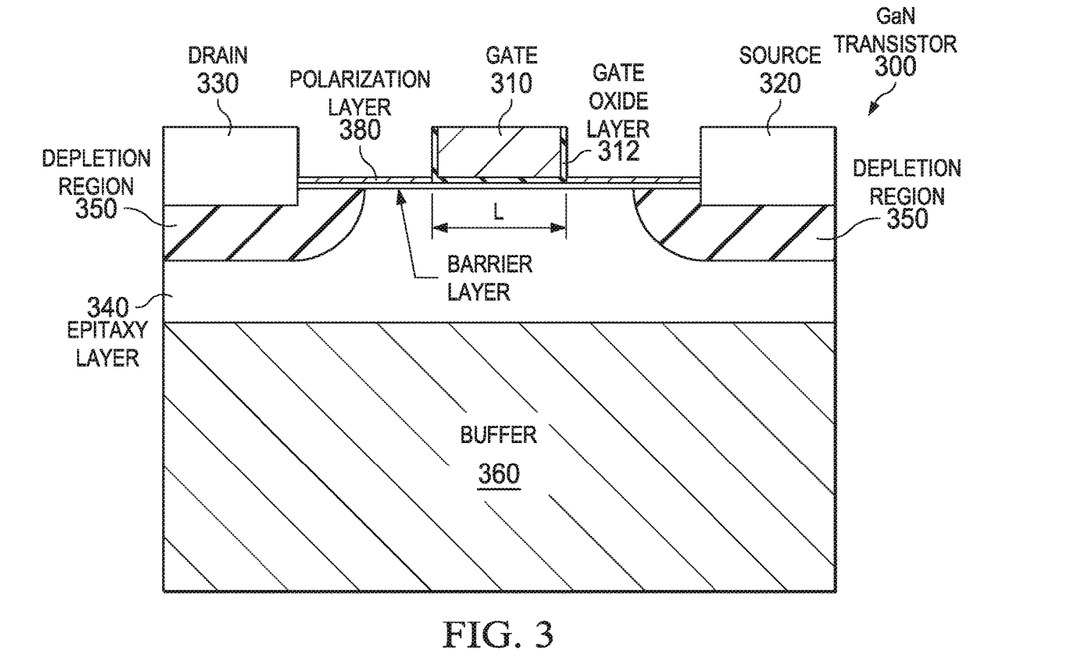
FIG. 3 is a cutaway side view of a gallium-nitride (GaN) transistor according to one or more examples of the present Specification.

FIG. 3 is a cutaway front view of a planar GaN transistor 300 according to one or more examples of the present Specification. Certain features of some embodiments are not illustrated or labeled in this FIGURE for purposes of simplicity, and to focus attention on certain aspects of the disclosure that are most relevant to the present disclosure. However, the transistor illustrations used throughout this Specification are intended to be non-limiting, and the omission of certain features or items from the illustrations is not intended to imply that those features or items must be omitted, or that they are incompatible with embodiments of the Specification.

GaN-based transistors may offer many advantages over silicon transistors, such as high efficiency, and high voltage operation. Thus, GaN is often used as a basis for power FETs that operate with input voltages up to the kilovolt range, though other applications are possible, such as input voltages in the tens or hundreds of volts. GaN transistors may also offer lower loss in power electronics than silicon, and may cut energy consumption, because they may have much lower impedance than their silicon counterparts.

GaN transistor 300 may be manufactured according to traditional methods, including deposition first of a GaN buffer layer 360. GaN is a hard crystalline substance that is suitable in particular for use in power electronics. In embodiments where GaN transistor 300 is intended to be integrated with a silicon-based IC, a thin isolation layer, such as aluminum nitride (AlN) may be grown on the silicon substrate first. A relatively thick buffer layer 360 of resistive GaN may then be grown on top of the isolation layer.

An epitaxy layer 340 may then be grown above buffer 360. Traditionally, epitaxy layer 340 is doped, either intentionally or unintentionally. Epitaxy layer 340 provides electron mobility between drain 330 and source 320, thus forming a channel of length L. The doping of epitaxy layer 340 may be p-type doping.

A polarization layer 380 is disposed above epitaxy layer 340, with a gate oxide layer 312, and gate 310 disposed above that. Note that polarization layer 380 is generally not provided in silicon transistors, but is unique to GaN transistors. Gate 310 defines the channel of length L in epitaxy layer 340. Polarization layer 380 induces an electron accumulation layer in epitaxy layer 340, which electrically connects the source and drain to the channel. Source 320 and drain 330 may typically be doped with a polarity opposite to that of epitaxy layer 340. A gate oxide layer 312 is disposed between epitaxy layer 340 and gate 310.

Gate 310 may be made of a metal such as aluminum, of polysilicon, or any other suitable material, or multiple layers of different material. Gate 310 is disposed to control current flow between source 320 and drain 330. In some embodiments, a substantially steady-state current flows when no signal is applied at gate 310, and ceases to flow when a sufficient voltage (e.g., greater than a threshold voltage $V_{to}$) is applied to gate 310.

A depletion region 350 is also shown. Depletion region 350 is a zone where mobile charge carriers have been pushed away diffused, such as by an electric field. The size of depletion region 350 is generally proportional to the magnitude of an input voltage (i.e., the magnitude of potential difference between source 320 and drain 330, $v_{DS}$). If the depletion region grows large enough, it can span the entire channel across length L, thus creating unwanted conductivity between source 320 and drain 330. This can result in leakage currents flowing from source 320 to drain 330 even when gate 310 is biased to turn the device off.

In some cases, this effect is somewhat self-limiting. For power GaN MOSFETs configured for use with kilovolt-scale inputs, length L may be long enough that depletion region 350 will not reach to source 330, even at or near a maximum rated input voltage $V_{DS}$. But when input voltages are relatively smaller (tens or hundreds of volts), it is advantageous to build smaller transistors. In that case, L may not be long enough by itself to prevent depletion region 350 from reaching from drain 320 to source 330. Thus, an unwanted leakage current may begin to flow at voltages lower than the limit of the MOSFET absent depletion region 350. In other words, for smaller values of L, transistor 300 cannot take full advantage of its performance characteristics because depletion region 350 becomes a limiting factor. Thus, it is advantageous to limit the size of depletion region 350 to permit a GaN transistor to take full advantage of its performance characteristics.

In certain existing production methods, the size of the depletion region is limited through the use of intentional or unintentional doping in epitaxy layer 340. In the case of an NMOS GaN transistor, this doping is of p-type polarity. Some common examples are Fe or C atoms introduced into the lattice.

However, the intentional or unintentional doping in the epitaxy layer causes a mobility degradation in the channel region. This degraded mobility reduces the current flow in the MOSFET and also increases the overall resistance of the device in the ON-state.

Figure 4:
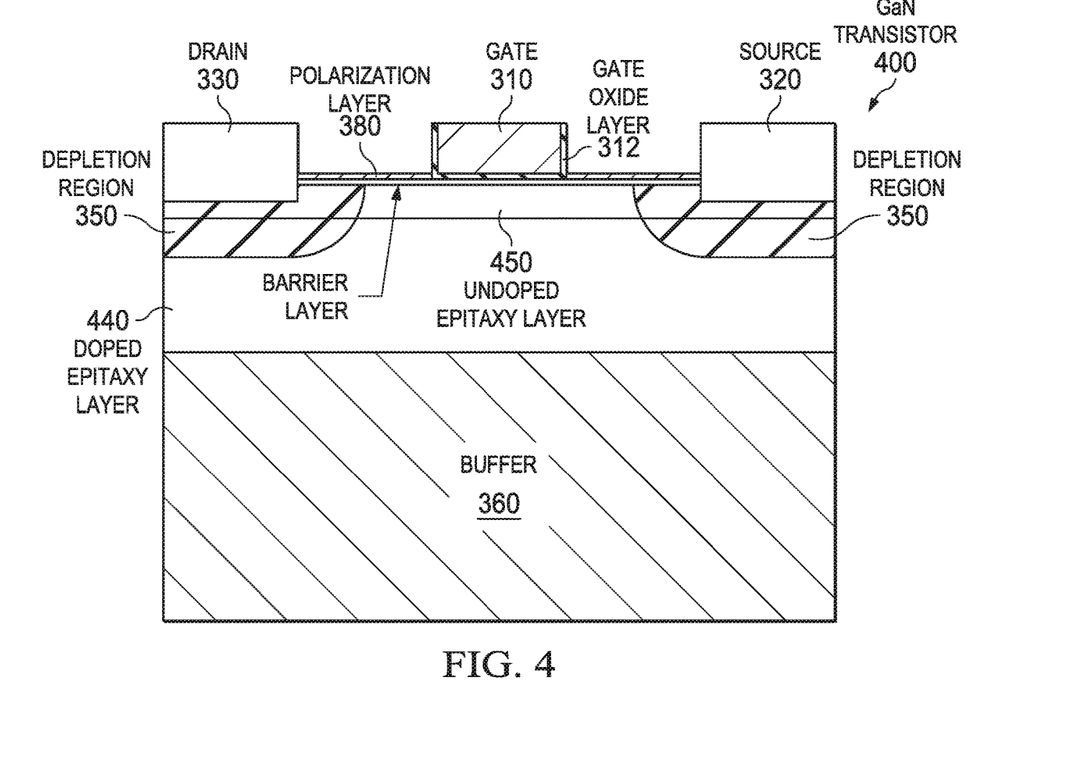
FIG. 4 is a cutaway side view of a GaN transistor according to one or more examples of the present Specification.

FIG. 4 is a cutaway side view of a GaN power MOSFET 400 according to one or more examples of the present Specification. Transistor 400 is configured to reduce the size of depletion region 350 relative to the design of transistor 300 of FIG. 3.

In this example, transistor 400 is of a similar design to transistor 300 of FIG. 3. A buffer 360 is deposited, possibly over a silicon substrate with an AlN isolation layer. A gate 310, gate oxide layer 312, polarization layer 380, source 320, and drain 330 are also provided, as before.

Unlike transistor 300 of FIG. 3, GaN transistor 400 includes a second epitaxy layer, here referred to as undoped epitaxy layer 450. Undoped epitaxy layer 450 provides enhanced mobility in the "on" state, while also providing good control in the "off" state. It should be noted that undoped epitaxy layer 450 may be a separate, discrete layer from doped epitaxy layer 440. In a nonlimiting embodiment, undoped epitaxy layer 450 may be between 20 nm and 100 nm thick. In other embodiments, undoped epitaxy layer 450 may provide a more graduated transition from doped epitaxy layer 440. It should also be noted that "doped" and "undoped" as used herein need not necessarily indicate that undoped epitaxy layer 450 is completely devoid of any doping. Rather, it may be relatively less doped than doped epitaxy layer 440. In another embodiment, "undoped" indicates that undoped epitaxy layer 450 lacks doping of the same polarity as doped epitaxy layer 440, but undoped epitaxy layer 450 may in fact be doped to the opposite polarity (e.g., doped epitaxy layer 440 may include p-type doping, and undoped epitaxy layer 450 may include n-type doping). Note that in embodiments where undoped epitaxy layer 450 includes opposite polarity doping, polarization layer 380 may not be necessary (though it may still optionally be included).

Advantageously, undoped epitaxy layer 450 may result in a substantially smaller depletion region 350. Undoped epitaxy layer 450 allows for increased mobility in the channel and allows for doping to be increased in doped epitaxy layer 440, thus increasing punchthrough resistance without affecting channel mobility. So with input voltages in the range of tens to hundreds of volts, GaN transistor 400 may have a substantially smaller L than, for example, GaN transistor 300, which may have a kilovolt input range. With the smaller depletion region, depletion region 350 still does not punch through the smaller L of GaN transistor 400, thereby causing unwanted leakage currents.

Figure 5:
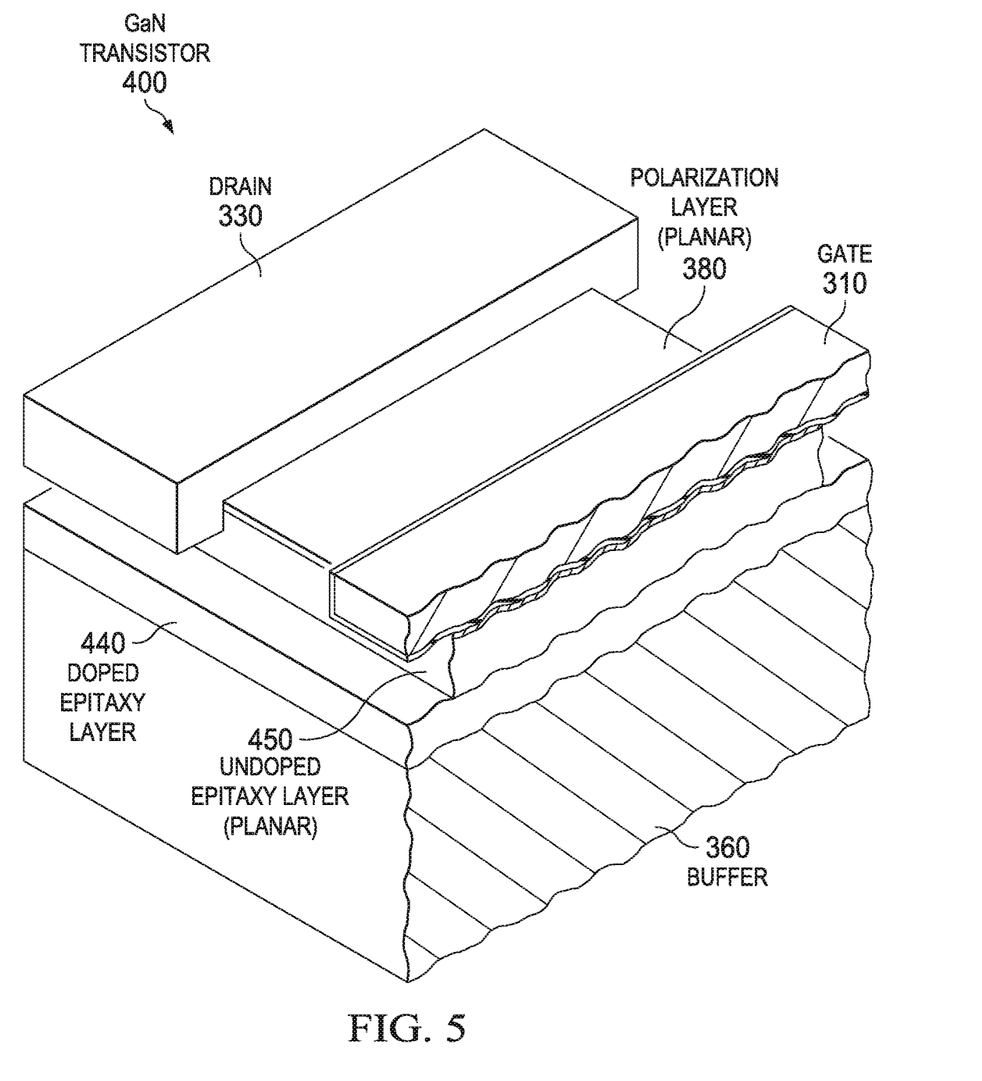
FIG. 5 is a cutaway perspective view of a GaN transistor according to one or more examples of the present Specification.

FIG. 5 is a cutaway perspective view of GaN transistor 400 according to one or more examples of the present Specification. This embodiment may be substantially identical to GaN transistor 400 of FIG. 4. Note that buffer 360, doped epitaxy layer 440, undoped epitaxy layer 450, and polarization layer 380 are all shown as before. Gate 310 and drain 330 are also visible. In this view, to accommodate the cutaway perspective, source 320 is not shown.

In this embodiment, undoped epitaxy layer 450 is substantially planar, and polarization layer 380 overlays undoped epitaxy layer 450 in a planar fashion as well. Gate 310 sits above polarization layer 380. This embodiment may realize all the advantages of GaN transistor 400 of FIG. 4.

Figure 6:
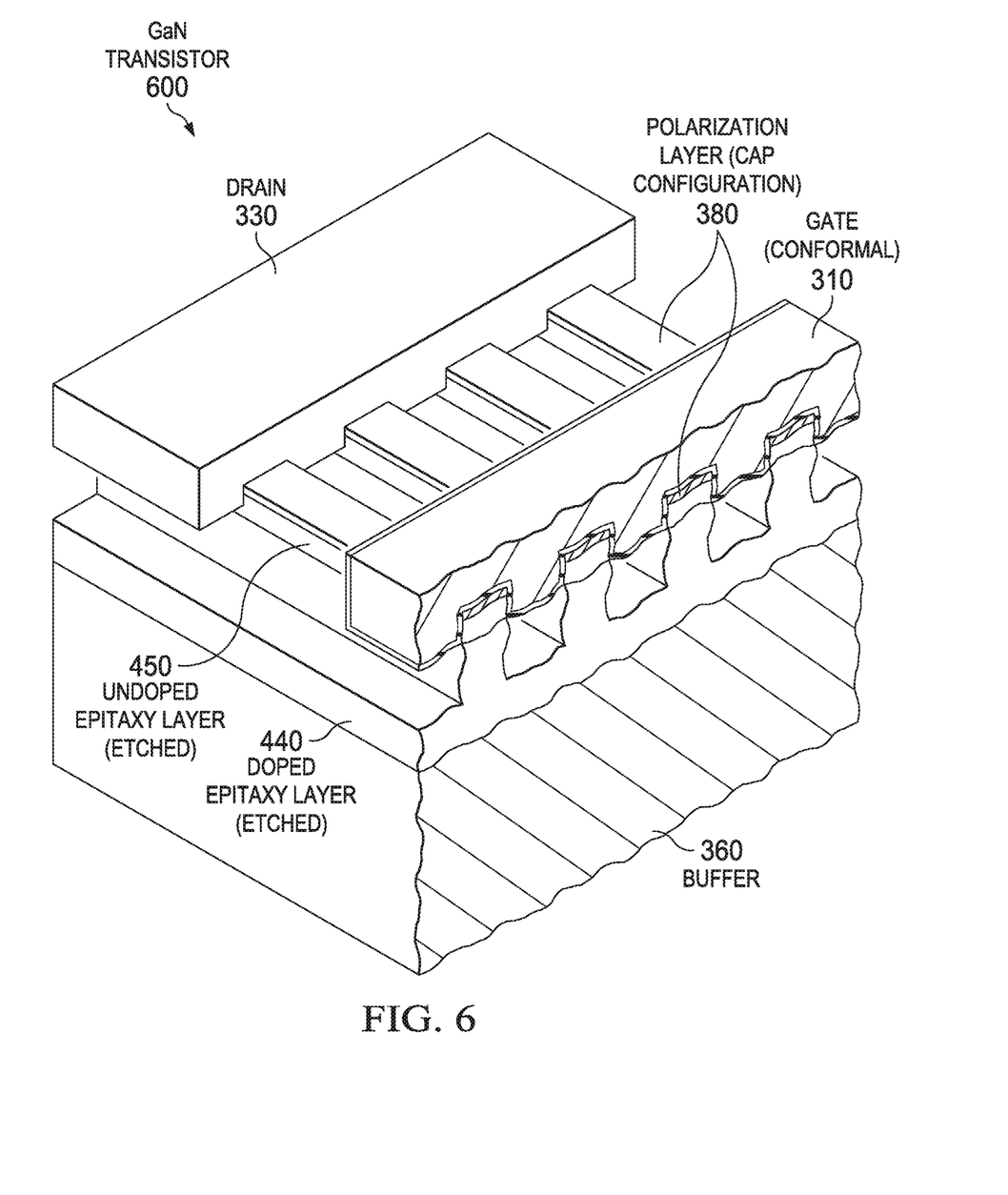
FIG. 6 is a cutaway perspective view of a GaN transistor according to one or more examples of the present Specification.

FIG. 6 is a cutaway perspective view of a GaN transistor 600 according to one or more examples of the present Specification. GaN transistor 600 includes a buffer 360, doped epitaxy layer 440, undoped epitaxy layer 450, polarization layer 380, gate 310, drain 330, and source (not shown).

GaN transistor 600 differs from GaN transistor 400 in that doped epitaxy layer 440 and undoped epitaxy layer 450 are etched into a plurality of square or rectangular ridges. The etching in this case is relatively square. In other words, the width W of each ridge is of a similar magnitude to the height H, or at least an appreciable fraction thereof (such as $$W \approx \frac{1}{2}H$$

or greater). Polarization layer 380 may be disposed along the top of each ridge in a "cap" configuration.

Gate 310, drain 330, and source (not shown) may also be etched or deposited to wrap conformally around the ridges. Current flows along the top of the ridges, and gate 310 wraps around three sides. Stated differently, there are essentially three gates (left, right, and top) controlling the electrostatics of each ridge in the undoped epitaxy layer 450 structure. This gives gate 310 better control over the electrostatics of undoped epitaxy layer 450. This can further decrease punchthrough.

FIG. 7 is a cutaway perspective view of a GaN transistor 700 according to one or more examples of the present Specification. GaN transistor 700 differs from GaN transistor 400 in that doped epitaxy layer 440 and undoped epitaxy layer 450-2 are etched into a plurality of square or rectangular ridges. The etching in this case is relatively square. In other words, the width W of each ridge is of a similar magnitude to the height H, or at least an appreciable fraction thereof (such as approximately $$W \geq \frac{1}{2}H).$$

).

Gate 310, drain 330, and source (not shown) may also be etched or deposited to wrap conformally around the ridges. Current flows along the top of the ridges, and gate 310 wraps around three sides. Stated differently, there are essentially three gates (left, right, and top) controlling the electrostatics of each ridge in the undoped epitaxy layer 450 structure. This gives gate 310 better control over the electrostatics of undoped epitaxy layer 450. This can further decrease punchthrough.

GaN transistor 700 also differs from transistor 600 in that rather than providing polarization layer 380 in a purely "cap" configuration, a hybrid polarization layer 380 is provided. Specifically, a first portion polarization layer 380-1 is provided in a planar configuration, between drain 330 and gate 310. A second portion polarization layer 380-2 may be provided in a "cap" configuration over ridges, but only underneath gate 310, drain 330, and source (not shown), which conformally wrap around the ridges.

FIG. 8 is a cutaway perspective view of a GaN transistor 800 according to one or more examples of the present Specification. GaN transistor 800 differs from GaN transistor 400, 600, and 700 in that doped epitaxy layer 440 and undoped epitaxy layer 450 are etched into a plurality of "fins." The etching in this case is relatively unsquare. In other words, the width W of each ridge is of substantially smaller magnitude than the height H (such as W«H).

Gate 310, drain 330, and source (not shown) may also be etched or deposited to wrap conformally around the fins. Current flows along the top of the fins, and gate 310 wraps around three sides. Stated differently, there are essentially three gates (left, right, and top) controlling the electrostatics of each ridge in the undoped epitaxy layer 450 structure. This gives gate 310 better control over the electrostatics of undoped epitaxy layer 450. This can further decrease punch-through.

However, because the width of each fin is very small, it is difficult to deposit a useful polarization layer 380 along the tops of the fins. Rather, undoped epitaxy layer 450 may receive a doping of opposite polarity to doped epitaxy layer 440. For example, doped epitaxy layer 440 may be doped according to a first doping profile (p-type doping) and undoped epitaxy layer 450 may be doped according to a second doping profile (n-type doping). In some embodiments, this may obviate the need for polarization layer 380.

Figure 9:
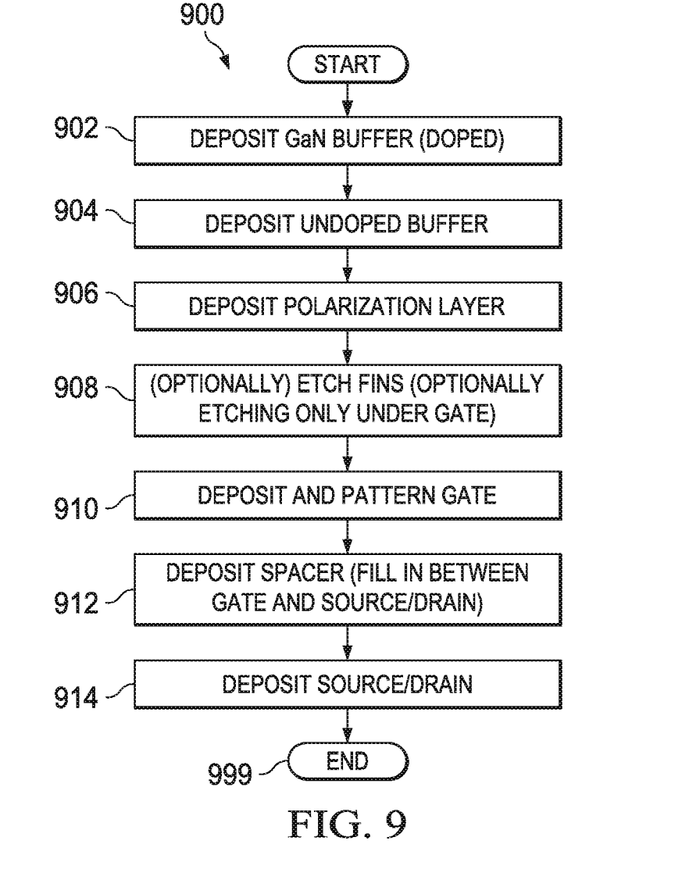
FIG. 9 is a flowchart of a method of manufacturing a GaN transistor according to one or more examples of the present Specification.

FIG. 9 is a flow chart of a method 900 according to one or more examples of the present Specification. It should be noted that method 900 is provided as a nonlimiting example only. The operations of method 900 are provided in a useful, illustrative order, but unless otherwise explicitly stated, the operations need not be performed expressly in the outlined order. Furthermore, some operations may be omitted as appropriate to various embodiments, while any number of other operations may be interposed between those disclosed where necessary or desirable.

In block 902, a doped GaN buffer layer 360 and doped epitaxy layer 440 are deposited on a substrate, possibly above a thin isolation layer, such as AlN.

In block 904, an undoped buffer layer, comprising undoped epitaxy layer 450, is deposited above doped epitaxy layer 440.

In block 906, a polarization layer 380 (which may include several layers, such as a barrier layer and several and several polarization layers of various compositions) is deposited, if appropriate to the embodiment. Note that in some embodiments, no polarization layer 380 is deposited, and undoped epitaxy layer 480 may be doped with doping of opposite polarity to that of doped epitaxy layer 440.

In block 908, as appropriate to the embodiment, fins or ridges may be etched in undoped epitaxy layer 450, possibly reaching down into doped epitaxy layer 440. In some embodiments, etching will be performed only under the gate, drain, and source so that they can be conformally deposited around the etching.

In block 910, the gate metal 310 is deposited and patterned.

In block 912, a spacer material between gate 310, source 320, and drain 330 may be deposited.

In block 914, source 320 and drain 330 are deposited.

In block 999, the method is done.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

All or part of any hardware element disclosed herein may readily be provided in a system-on-a-chip (SoC), including central processing unit (CPU) package. An SoC represents an integrated circuit (IC) that integrates components of a computer or other electronic system into a single chip. Thus, for example, client devices 110 or server devices 300 may be provided, in whole or in part, in an SoC. The SoC may contain digital, analog, mixed-signal, and radio frequency functions, all of which may be provided on a single chip substrate. Other embodiments may include a multi-chip-module (MCM), with a plurality of chips located within a single electronic package and configured to interact closely with each other through the electronic package. In various other embodiments, the computing functionalities disclosed herein may be implemented in one or more silicon cores in Application Specific Integrated Circuits (ASICs), Field Programmable Gate Arrays (FPGAs), and other semiconductor chips.

Note also that in certain embodiment, some of the components may be omitted or consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, and equipment options.

In a general sense, any suitably-configured processor, such as processor 210, can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, a storage may store information in any suitable type of tangible, non-transitory storage medium (for example, random access memory (RAM), read only memory (ROM), field programmable gate array (FPGA), erasable programmable read only memory (EPROM), electrically erasable programmable ROM (EEPROM), etc.), software, hardware (for example, processor instructions or microcode), or in any other suitable component, device, element, or object where appropriate and based on particular needs. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein should be construed as being encompassed within the broad terms 'memory' and 'storage,' as appropriate. A non-transitory storage medium herein is expressly intended to include any non-transitory special-purpose or programmable hardware configured to provide the disclosed operations, or to cause a processor such as processor 110 to perform the disclosed operations.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high-level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processor and memory can be suitably coupled to the board based on particular configuration needs, processing demands, and computing designs. Other components such as external storage, additional sensors, controllers for audio/video display, and peripheral devices may be attached to the board as plug-in cards, via cables, or integrated into the board itself. In another example, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the Specification, to limit this disclosure in any way that is not otherwise expressly reflected in the appended claims.

EXAMPLE IMPLEMENTATIONS

There is disclosed in one example, a gallium nitride (GaN) field effect transistor (FET) having a gate, a drain, and a source, comprising: a doped GaN buffer layer; a first epitaxy layer above the buffer layer, the first epitaxy layer having a first doping profile; and a second epitaxy layer above the first epitaxy layer, the second epitaxy layer having a second doping profile.

There is further disclosed an example, wherein the GaN FET is a power FET.

There is further disclosed an example, wherein the first doping profile is doped, and the second doping profile is undoped.

There is further disclosed an example, further comprising a polarization layer above the second epitaxy layer.

There is further disclosed an example, wherein the polarization layer is planar.

There is further disclosed an example, wherein the polarization layer is partially planar, and wherein the polarization layer is etched beneath the gate.

There is further disclosed an example, wherein the polarization layer is finned.

There is further disclosed an example, wherein the first epitaxy layer is doped with a first polarity, and the second epitaxy layer is doped with a second polarity.

There is further disclosed an example, wherein the second epitaxy layer is finned.

There is further disclosed an example, wherein the second epitaxy layer is ridged.

There is further disclosed in an example, an integrated circuit, comprising the GaN FET of any of the preceding claims.

There is further disclosed an example, wherein the integrated circuit is a system-on-a-chip.

There is further disclosed an example, wherein the integrated circuit is a radio frequency circuit.

There is further disclosed in an example, a switching power supply, comprising: a power input node to receive an unregulated input signal; a power output node to provide a regulated output signal; and a power regulator circuit comprising at least one gallium-nitride (GaN) power field effect transistor (FET), comprising: a doped GaN buffer layer; a first epitaxy layer above the buffer layer, the first epitaxy layer having a first doping profile; and a second epitaxy layer above the first epitaxy layer, the second epitaxy layer having a second doping profile.

There is further disclosed an example, wherein the first doping profile is doped, and the second doping profile is undoped.

There is further disclosed an example, further comprising a polarization layer above the second epitaxy layer.

There is further disclosed an example, wherein the polarization layer is planar.

There is further disclosed an example, wherein the polarization layer is partially planar, and wherein the polarization layer is etched beneath the gate.

There is further disclosed an example, wherein the polarization layer is finned.

There is further disclosed an example, wherein the first epitaxy layer is doped with a first polarity, and the second epitaxy layer is doped with a second polarity.

There is further disclosed an example, wherein the second epitaxy layer is finned.

There is further disclosed an example, wherein the second epitaxy layer is ridged.

There is further disclosed in an example, a system on a chip comprising a power manager for providing managed power to a plurality of computing elements, the power manager comprising the switching power supply of any preceding example.

There is further disclosed in an example, a method of manufacturing a gallium nitride (GaN) transistor, comprising: depositing a buffer layer; depositing a first epitaxy layer having a first doping profile; depositing a second epitaxy layer having a second doping profile; depositing a gate; and depositing a drain and source.

There is further disclosed an example, wherein the first doping profile is doped, and the second doping profile is undoped.

There is further disclosed an example, further comprising depositing a polarization layer.

There is further disclosed an example, wherein the first doping profile is doping of a first polarity, and the second doping profile is doping of a second polarity.

There is further disclosed an example, further comprising etching the second epitaxy layer into ridges or fins.

The invention claimed is:

1. A gallium nitride (GaN) field effect transistor (FET), comprising:
    a buffer layer comprising gallium and nitrogen;
    a first epitaxy layer, the first epitaxy layer having a first doping profile; and
    a second epitaxy layer, the second epitaxy layer having a second doping profile,
    wherein:
        the first epitaxy layer is between the buffer layer and the second epitaxy layer, and
        at least a portion of the second epitaxy layer forms a fin.

2. The GaN FET of claim 1, wherein the GaN FET is a power FET.

3. The GaN FET of claim 1, wherein the first doping profile is doped, and the second doping profile is undoped.

4. The GaN FET of claim 3, further comprising a polarization layer above the second epitaxy layer.

5. The GaN FET of claim 4, wherein the polarization layer is planar.

6. The GaN FET of claim 4, wherein the polarization layer is partially planar, and wherein the polarization layer is etched beneath the gate.

7. The GaN FET of claim 4, wherein the polarization layer is finned.

8. The GaN FET of claim 1, wherein the first epitaxy layer is doped with a first polarity, and the second epitaxy layer is doped with a second polarity.

9. A gallium nitride (GaN) field effect transistor (FET), comprising:
    a buffer layer comprising gallium and nitrogen;
    a first epitaxy layer, the first epitaxy layer having a first doping profile;
    a second epitaxy layer, the second epitaxy layer having a second doping profile; and
    a polarization layer,
    wherein:
        the first epitaxy layer is between the buffer layer and the second epitaxy layer,
        the second epitaxy layer is between the first epitaxy layer and the polarization layer, and
        at least a portion of the polarization layer forms a fin.

10. The GaN FET of claim 9, wherein the GaN FET is a power FET.

11. The GaN FET of claim 9, wherein the first doping profile is doped, and the second doping profile is undoped.

12. The GaN FET of claim 9, wherein the polarization layer is partially planar, and wherein the polarization layer is etched beneath the gate.

13. The GaN FET of claim 9, wherein the first epitaxy layer is doped with a first polarity, and the second epitaxy layer is doped with a second polarity.

14. The GaN FET of claim 9, wherein the second epitaxy layer is finned.

15. A computing device, comprising:
    a memory, and
    a gallium nitride (GaN) field effect transistor (FET), comprising:
        a buffer layer comprising gallium and nitrogen;
        a first epitaxy layer, the first epitaxy layer having a first doping profile; and
        a second epitaxy layer, the second epitaxy layer having a second doping profile;
    wherein:
        the first epitaxy layer is between the buffer layer and the second epitaxy layer, and
        at least a portion of the second epitaxy layer forms a fin.

16. The computing device of claim 15, wherein the GaN FET is a power FET.

17. The computing device of claim 15, wherein the first doping profile is doped, and the second doping profile is undoped.

18. The computing device of claim 15, further comprising a polarization layer above the second epitaxy layer.

19. The computing device of claim 18, wherein the polarization layer is planar.

20. The computing device of claim 18, wherein the polarization layer is partially planar, and wherein the polarization layer is etched beneath the gate.

21. The computing device of claim 18, wherein the polarization layer is finned.

22. The computing device of claim 15, wherein the first epitaxy layer is doped with a first polarity, and the second epitaxy layer is doped with a second polarity.

23. The computing device of claim 15, wherein the second epitaxy layer is finned.

* * * * *